United States Patent [19]

Mueller

[11] Patent Number: 5,656,575
[45] Date of Patent: Aug. 12, 1997

[54] METHOD AND APPARATUS FOR FABRICATING WEAK LINK JUNCTIONS ON VICINALLY CUT SUBSTRATES

[75] Inventor: Carl H. Mueller, Lakewood, Colo.

[73] Assignee: Superconducting Core Technologies, Inc., Golden, Colo.

[21] Appl. No.: 387,594

[22] Filed: Feb. 13, 1995

[51] Int. Cl.[6] ................................................. C30B 25/02
[52] U.S. Cl. ........................ 505/190; 505/234; 505/329; 505/702
[58] Field of Search ............................. 505/190, 234, 505/329, 702

[56] References Cited

U.S. PATENT DOCUMENTS

| | | | |
|---|---|---|---|
| 5,157,466 | 10/1992 | Char et al. | 505/702 |
| 5,366,953 | 11/1994 | Char et al. | 505/329 |
| 5,464,812 | 11/1995 | Inada et al. | 505/234 |

OTHER PUBLICATIONS

Sugimoto et al. "Evidence for Step Flow Growth of Bi–S-r–Ca–Cu–O Thin Films on Vicinal Substrates in", Appl. Phys. Letters, 63(19), 8 Nov. 1993 pp. 2697–2699.

Char et al., "Bi–Epitaxial Grain Boundary Junctions In $YBa_2Cu_3O_7$", American Institute of Physics, Appl. Phys. Lett., vol. 59, No. 6, 5 Aug. 1991, pp. 733–735.

Dimos et al., "Orientation of Grain–Boundary Critical Currents In $YBa_2Cu_3O_{7-\delta}$ Bicrystals", The American Physical Society, Physical Review Letters, vol. 61, No. 2, 11 Jul. 1988, pp. 219–222.

Lowndes et al., "Suppression of the Spiral–Growth Mechanism In Epitaxial $YBa_2Cu_3O_{7-x}$ Films Grown on Miscut Substrates", American Institute of Physics, Appl. Phys. Lett. 61, (7), 17 Aug. 1992, pp. 852–854.

Mannhart et al., "High–$T_c$ Thin Films, Growth Modes—Structure—Applications", Invited Presentation at NATO ASI Course on Materials and Crystallographic Aspects of High$T_c$ Superconductivity, Erice, Italy, May 17–29, 1993, pp. 1–18.

Streiffer et al., "Growth of $YBa_2Cu_3O_{7-\delta}$ on Vicinally Polished MgO Substrates", American Institute of Physics, Appl. Phys. Lett. 57 (23), 3 Dec. 1990, pp. 2501–2503.

Primary Examiner—Robert Kunemund
Attorney, Agent, or Firm—Sheridan Ross, P.C.

[57] ABSTRACT

The present invention provides a superconducting device having a weak link junction with an angle at the grain boundary between the two superconductor crystals being variable. The angle at the junction is substantially equivalent to a vicinal angle for the substrate. Accordingly, the magnitude of the angle at the junction can be varied by varying the vicinal angle of the substrate. This result can be realized by using buffer layers of different compositions underlying the superconducting materials on either side of the weak link junction. Weak link junctions and reproducible properties are essential for a variety of electronic and magnetic sensing devices.

45 Claims, 6 Drawing Sheets

METHOD AND APPARATUS FOR FABRICATING WEAK LINK JUNCTIONS ON VICINALLY CUT SUBSTRATES

FIELD OF THE INVENTION

The present invention relates generally to superconductors and specifically to superconductors connected by a weak link junction.

BACKGROUND OF THE INVENTION

The significantly increased efficiencies of superconductors compared to other types of electrical conductors have caused superconductors to be considered for an increasing number of applications. Superconductors are electrical conductors that have virtually no measurable resistance to electrical flow below a critical temperature and under specific magnetic and electrical conditions. Specifically, superconductivity terminates if the magnetic field in the material is equal to or greater than a threshold field strength (known as the critical field), if the material carries a current equal to or greater than a threshold amount (known as the critical current), or if the material has a current density equal to or greater than a threshold amount (known as the critical current density).

Superconducting devices typically have two or three terminals. Both types of devices have a supercurrent flowing between two terminals. Unlike the two-terminal superconducting devices, however, the supercurrent in a three-terminal superconducting device is controlled by the use of a third terminal (e.g., either by applying magnetic fields or electric fields or by injecting electrical current at the third terminal).

Superconductors that are electrically connected by weak link junctions are particularly useful for a number of two and three-terminal superconducting devices. A "weak link junction" refers to a volume of a superconductor over which superconductivity is degraded (e.g., the superconducting wave function and therefore the critical current are depressed) and includes Josephson-junction types of weak link junctions. Exemplary applications for superconducting devices having weak link junctions include digital-to-analog converters, transistor devices, picosecond processors, and superconducting quantum interferometric devices (that detect and/or measure extremely small currents, voltages, and/or magnetic fields).

The discrepancy that exists between the critical current densities of the weak link junction and the regions of the superconductor removed from the junction is the basis for the above-noted devices. For example, the low critical current densities of weak link junctions enables them to be switched from the superconducting to non-superconducting states (analogous to the "voltage-on" to "voltage-off" states used in semiconductor devices) by passing small electrical currents through them; thus they are attractive for high-speed, low power switching applications. The current-carrying capacities of weak link junctions are also sensitive to small magnetic fields and thus a key component in devices used to measure extremely weak magnetic fields. Another use for weak link junctions is for the generation of high-frequency microwave signals (e.g., 72 GHz oscillators), which operate by applying a DC voltage to an array of weak link junctions. If the superconducting properties of the weak-link junctions are sufficiently uniform, the junctions couple to each other to produce a high-frequency signal.

In one weak link junction configuration, the weak link junction exists at the boundary between two or more superconductor crystals of different orientations (with the boundary being known as a high angle grain boundary). The disorder in the crystal structure at the boundary diminishes the magnitude of the supercurrent by breaking apart the electron hole pairs which create supercurrent. The breaking apart of the electron hole pairs decreases the number of electron hole pairs which can be propagated across the junction (relative to the superconducting regions away from the junction); thus decreasing the magnitude of supercurrent which can be propagated across the junction relative to the regions away from the junction.

Several methods exist to form high angle grain boundaries at the boundary between two superconductor crystals. One method is to fabricate bicrystalline superconductors on bicrystalline substrates (known as a bicrystalline junction). With this technique, one crystallographic axis in the first crystal is parallel to one crystallographic axis in the second crystal, and the other two crystallographic axes of the first crystal are rotated at an arbitrary angle relative to the remaining two crystallographic axes of the second crystal. In this arrangement, the surface of the bicrystal is perpendicular to the common crystallographic direction, and the superconducting film is deposited on the substrate surface. The weak link occurs at the junction of the bicrystal because the high-angle grain boundary formed at the bicrystal junction propagates into the superconducting film. This type of weak link junction is often referred to as an "in-plane" grain boundary junction because the grain boundary is formed via a rotation of the crystallographic axes on either side of the junction, about the normal to the substrate plane. There is considerable expense associated with preparing bicrystalline substrates, and the electrical properties of weak link junctions prepared using this technique are not sufficiently reproducible for many applications. Another drawback to using bicrystalline substrates is the weak link junctions must be aligned along the single row where the substrates are joined, thus the technique is not amenable for use in integrated circuit applications.

In another method for forming a high angle grain boundary, a seed layer, such as MgO, is used to control the crystal structure of the superconductor. The seed layer is deposited on a portion of a monocrystalline substrate; then a buffer layer, such as $SrTiO_3$, is subsequently deposited on the top of the substrate and the seed layer, and finally a superconductor, such as $YBa_2Cu_3O_7$ (YBCO), is deposited on top of the buffer layer. The seed layer causes an in-plane rotation of the crystallographic axes of the portion of the buffer layer overlying the seed layer but no in-plane rotation of the portion of the buffer layer deposited directly on the substrate. The superconductor crystals form on the buffer layer with an in-plane orientation similar to that of the underlying portion of the buffer layer. As a consequence, the crystallographic planes of the superconductor crystals on either side of the boundary of the seed layer intersect at a 45 degree angle in the plane of the substrate (known as a biepitaxial junction). Like the bicrystalline junction, the angle between the crystallographic planes occurs only in the plane of the substrate, but the magnitude of the angle is limited to 45 degrees. The angle is limited to 45 degrees because this angle is the rotation which single-crystal seed layers adopt when deposited on the types of substrates (e.g., lanthanum aluminate, strontium titanate, yttria-stabilized zirconium oxide, and magnesium oxide) commonly used for the deposition of superconducting films.

The superconducting properties of bicrystalline and biepitaxial junctions have a high degree of variability and the properties of such junctions are therefore difficult to reproduce consistently in weak link junctions. The non-uniformity and wide variability of the superconducting properties of the junctions make the junctions unsuitable for many applications, particularly for applications requiring the use of multiple junctions. The adverse effects of the variability in the superconducting properties of such junctions are cumulative for multiple junctions. By way of example, in some applications hundreds or even thousands of weak link superconducting devices could be electrically interconnected.

In yet another method for forming a high angle grain boundary, a step is formed on the substrate using ion milling or chemical etching techniques, and the superconductor is deposited on the stepped surface. The high angle grain boundary between superconductor crystals results from differently oriented grains that nucleate at the surface step on the substrate (known as step-edge junction). The step size is typically 300 nm, and the superconducting film thickness is typically 100-300 nm. With step-edge junctions, the superconducting properties are critically dependent on the height of the step, the superconducting film thickness, and the quality of the superconducting film. Because it is difficult to control the magnitude of the step height, and because it is difficult to avoid damaging the crystalline quality of the substrate during the step fabrication process (which in turn degrades the quality of the superconducting film deposited on top of it), the step size and superconducting film properties typically fluctuate not only between steps on a given substrate but also among steps on a number of substrates. Because the superconducting properties of the step-edge junction are dependent upon the size of the step and superconducting film quality, the fluctuations cause the superconducting properties of step-edge junctions to be nonuniform and the properties of a given step-edge junction to be difficult to reproduce consistently. Accordingly, step-edge junctions suffer from the same problems as the bicrystalline and biepitaxial junctions.

There is a need for a weak link junction configuration that can be produced in large quantities with substantially uniform superconducting properties across the weak link junctions. There is a related need for a method to produce superconducting devices having weak link junctions formed by high angle grain boundaries that can be produced in large quantities with substantially equal angles at the grain boundaries.

There is also a need for a method to produce superconducting devices having weak link junctions formed by high angle grain boundaries that can produce a variety of different angles at the boundary. There is a related need for a method to produce such superconducting devices having a relatively low magnitude angle at the grain boundaries to reduce the amount of disordering at the boundaries to relatively low levels. There is a further need for a method to optimize the magnitude of the angle at the grain boundaries to produce the desired superconducting properties across the boundary while substantially minimizing the amount of disordering at the boundaries.

SUMMARY OF THE INVENTION

The present invention addresses the needs of the prior art by providing a superconducting device that includes: (i) a substrate having a substantially planar surface located at a vicinal angle to a crystallographic plane of the substrate; (ii) a first superconducting material located adjacent to the planar surface and having a first crystallographic plane that is substantially parallel to the substrate crystallographic plane; and (iii) a second superconducting material, contacting the first superconducting material to form a junction therebetween, located adjacent to the planar surface, the second superconducting material having a second crystallographic plane that is substantially parallel to the planar surface. The first and second crystallographic planes form a junction angle at the junction. The junction angle has substantially the same magnitude as the vicinal angle. The junction depresses the superconducting wave function across the junction, thereby creating a weak link junction.

The present invention is based at least in part upon the discovery that the non-uniformity in superconducting properties of existing weak link superconducting devices is caused by the relatively high amount of disorder in the crystal structure at the junction and the non-reproducibility of the disorder. The amount of disorder at the junction is not only directly related to the amount of degradation in superconducting properties across the junction, but also to the magnitude of the fluctuations in the superconducting properties across junctions having the same junction angle. For example, the 45 degree angle in the bicrystalline and biepitaxial junctions induces a high degree of disorder in the crystal structure at such junctions and therefore causes a wide degree of fluctuation in the superconducting properties across different junctions.

An important aspect of the device of the present invention is the ability to vary the magnitude of the junction angle by varying the magnitude of the vicinal angle, thereby making it possible to produce a weak link junction having a relatively low magnitude for the junction angle that will not only produce the desired superconducting properties across the junction but also minimize the amount of disordering at the junction and in the superconducting materials at a selected distance from the junction. This ability makes it possible to optimize the magnitude of the junction angle to realize the desired superconducting properties across the junction while minimizing disordering in the crystal structure. The invention thereby provides a weak link junction configuration that can be produced in large quantities with substantially uniform superconducting properties across the weak link junction.

The various components of the device of the present invention can have varying compositions. For example, the substrate is preferably a single crystal formed from a mixture of yttrium oxide and zirconium oxide. The first and second superconducting materials can include $Tl_2Ba_2CaCu_2O_8$, $Tl_2Ba_2Ca_2Cu_3O_{13}$, $Bi_2Sr_2Ca_2Cu_3O_{10}$, $Bi_2Sr_2CaCu_2O_8$, $YBa_2Cu_3O_{7-x}$, and other compounds in which the supercurrent is propagated primarily along Cu—O planes.

The preferred magnitude of the junction angle depends upon the orientation of the plane containing the junction angle. Since the coherence length of superconducting electron hole pairs (e.g., the distance that electron hole pairs can travel in a non-superconducting material without being broken apart) is anisotropic along the different crystallographic directions, the magnitude of the junction angle which will provide the desired electron hole pair de-coupling (thereby creating the weak link) is dependent on the orientation of the plane containing the junction. Since the superconducting critical current density in regions removed from the weak link junction must be higher than those at the junction, it is necessary to choose vicinal angles which are low enough that superconducting films with high critical current densities can be deposited, yet high enough that weak link junctions can be fabricated. If the orientation of the superconducting film is such that the <001> crystallographic axis (also referred to as the "c-axis") is substantially perpendicular to the substrate surface, and the junction is formed by a tilt of the c-axis relative to the substrate surface, the desired magnitude of the vicinal angle ranges from about 5 to 30 degrees. If the superconducting film is deposited such that the <100> crystallographic axis (commonly referred to as the "a-axis") is substantially perpendicular to the substrate surface, the desired magnitude of the vicinal angle ranges from about 2 to 20 degrees.

In a preferred embodiment, the device includes a first buffer layer between the first superconducting material and the substrate and a second buffer layer between the second superconducting material and the substrate. The lattice mismatches between the first buffer layer and the first superconducting material and between the second buffer layer and the second superconducting material determine the crystallographic orientations of the first and second superconducting materials relative to the crystallographic orientation of the vicinally-cut substrate. To determine the lattice mismatch between the superconductor and the substrate for example, the lattice mismatch is computed based on the following equation:

$$\text{Lattice mismatch} = \frac{\text{Lattice Parameter of Superconductor} - \text{Lattice Parameter of Substrate}}{\text{Lattice Parameter of Substrate}}$$

The preferred lattice mismatch between the first superconducting material and the first buffer layer preferably is no more than about 3%, and between the second superconducting material and the second buffer layer preferably is at least about 4%. To obtain the differing lattice mismatches, the first and second buffer layers are preferably of different compositions.

The present invention further includes a method for forming a weak link junction at the junction between two superconducting materials, including the following steps: (i) providing a substrate having a substantially planar surface oriented at a vicinal angle to a crystallographic plane of the substrate; (ii) first forming a first buffer layer on a portion of the substrate; (iii) second forming a first superconducting material above the first buffer layer, wherein the crystallographic lattice mismatch between the first buffer layer and the first superconducting material is sufficient to yield a first crystallographic plane in the first superconducting material that is substantially parallel to the substrate crystallographic plane; and (iv) third forming a second superconducting material above the substrate, the second superconducting material having a crystallographic plane that is substantially parallel to the planar surface thereby forming the weak link junction at the junction between the first and second superconducting materials. The method can further include the step of forming a second buffer layer between the second superconducting material and the substrate.

The present invention also includes a method for selecting the magnitude of the angle between the first and second crystallographic planes. The process includes the following steps: (i) first selecting a magnitude for at least one of the following variables for the weak link junction: critical current, critical current density, critical magnetic field, and normal state resistance; (ii) first forming a first weak link junction having a first junction angle between the crystallographic planes in the superconducting materials at the first weak link junction; (iii) first measuring a first critical current and a first normal state resistance across the first weak link junction; (iv) second forming a second weak link junction having a second junction angle between the crystallographic planes in the superconducting materials at the second weak link junction, the magnitude of the first junction angle being different from the magnitude of the second junction angle; (v) second measuring a second critical current and a second normal state resistance across the second weak link junction; and (vi) second selecting, based on the first and second critical currents and the first and second normal state resistances, a magnitude of a junction angle between the crystallographic planes in the superconducting materials at the weak link junction that is sufficient to produce the selected variable at the weak link junction while producing a relatively low amount of disordering in the crystal structure at the weak link junction.

Preferably, the magnitude of the junction angle is selected to substantially inhibit degradation in the superconducting properties of the superconducting materials at a distance from the weak link junction. By way of example, the critical current in the superconducting materials at a distance from the junction is preferably over about 100 times larger than the selected critical current across the weak link.

DETAILED DESCRIPTION

An important aspect of the present invention is the relationship between the vicinal angle of the substrate (e.g., the angle between the substrate surface and the (001) crystallographic planes) and the angle between the superconductor crystallographic planes at the weak link junction (e.g., junction angle). This result is preferably achieved by using buffer layers to cause differing crystallographic lattice mismatches between the superconductors and underlying buffer layers on either side of the junction. The differing lattice mismatches cause the crystallographic planes in the superconductor crystals on either side of the weak link junction to have orientations either substantially parallel to the substrate surface or a crystallographic plane of the substrate, thereby causing the junction angle to be substantially equivalent to the substrate vicinal angle.

The ability to control the magnitude of the junction angle at the weak link junction based on the magnitude of the substrate vicinal angle provides a weak link junction configuration that can be produced in large quantities with substantially uniform superconducting properties across the weak link junction. Unlike existing weak link junction configurations, superconducting devices of the present invention can have a virtually unlimited variety of junction angles and therefore a relatively low magnitude angle at the weak link junction to reduce the amount of disordering at the junction as low as possible for a desired level of depression in superconducting properties across the junction. As a consequence, the magnitude of the junction angle can be optimized relative to desired superconducting properties across the junction. The present invention further permits the junction angle to be readily reproduced in other superconducting devices.

FIGS. 1 through 4 depict a preferred embodiment of a superconducting device according to the present invention. The superconducting device 20 includes a common substrate 24, first and second buffer layers 28, 32, and first and second superconductors 36, 40 forming a weak link junction 44 between the superconductors. A first crystallographic plane 48 in the first superconductor 36 is substantially parallel to a first buffer crystallographic plane 52 and a substrate crystallographic plane 56. Preferably, the substrate crystallographic plane 56 is the (001) plane of the substrate (e.g., perpendicular to the <001> crystallographic direction). A second crystallographic plane 60 in the second superconductor 40 is substantially parallel to the substrate surface 64. The first and second crystallographic planes 48, 60 form a junction angle θ which is substantially identical in magnitude to the substrate vicinal angle ø. As noted above, the angles θ and ø are thus located in substantially parallel planes. The magnitude of θ is varied by varying the magnitude of ø.

Figure 4:
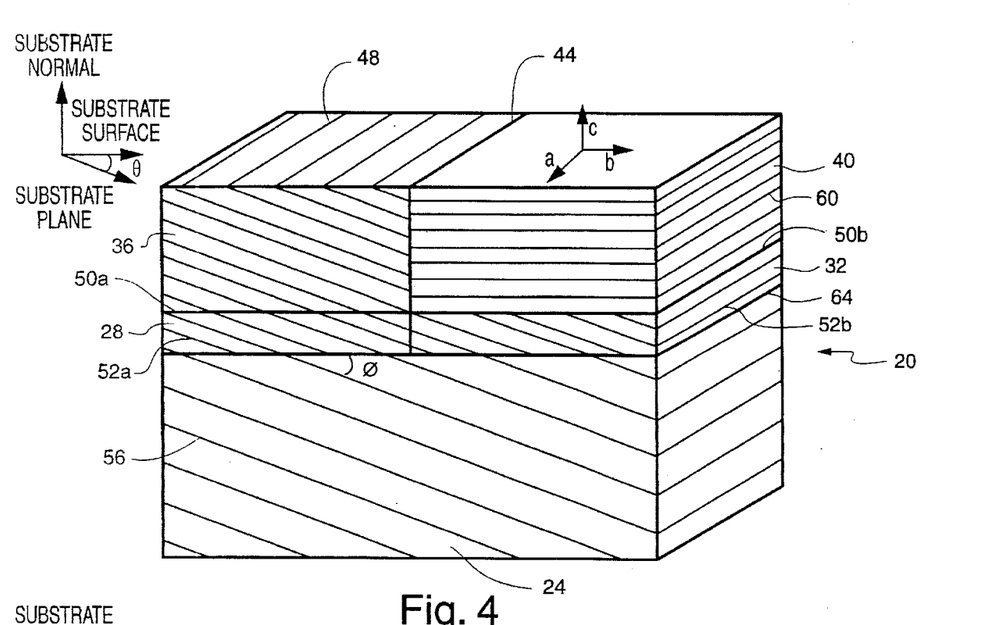
FIG. 4 is a three-dimensional view of a weak link junction according to a preferred embodiment of the present invention.

The operation of high angle grain boundary types of weak link junctions is not well established. While not wishing to be bound by any theory, it is believed that the electron hole pairs in the supercurrent travel along a superconductor crystallographic plane (which, for example, is a Cu—O plane in YBCO superconductors) and are scattered at the weak link junction 44, thereby causing a decrease in the superconducting properties across the weak link junction 44. If, for example, a supercurrent in FIG. 4 is flowing from the first to the second superconductor, the scattered electron hole pairs, after crossing the weak link junction, will attempt to migrate to the second crystallographic planes, as the planes offer the path of no electrical resistance to supercurrent flow. Smaller magnitudes of θ cause less disordering in the crystal structure and thereby facilitate the migration of the electron hole pairs to the second crystallographic planes after the electron hole pairs are scattered by the weak link junction. Larger magnitudes of θ, in contrast, cause more disordering in the crystal structure and thereby hinder the migration of the electron hole pairs to the second crystallographic planes. As a consequence, smaller magnitudes of θ experience a smaller decrease in superconducting properties across the weak link junction 44 than larger magnitudes of θ.

Figure 1:
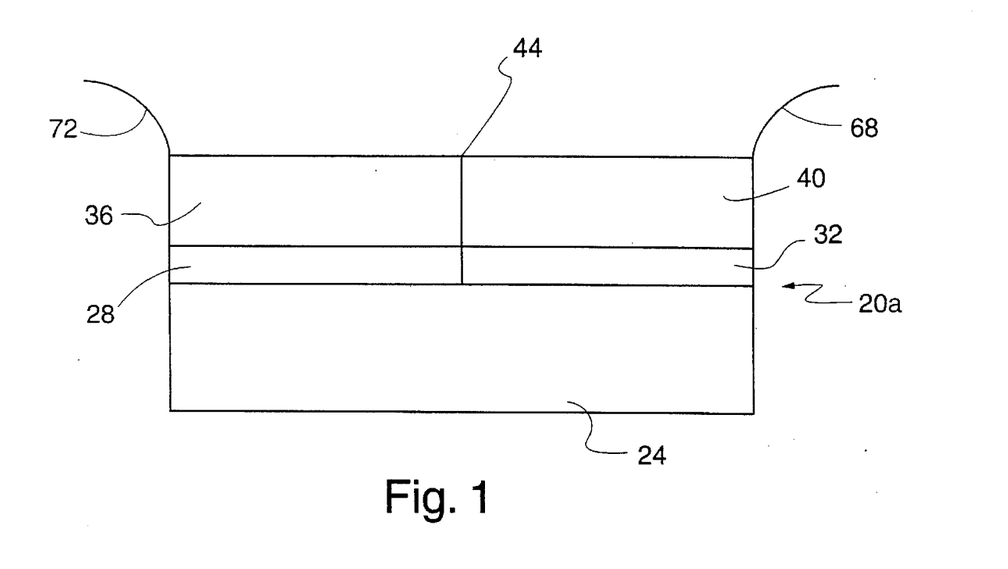
FIG. 1 is a side view of a two-terminal superconducting device according to a preferred embodiment of the present invention.
Figure 2:
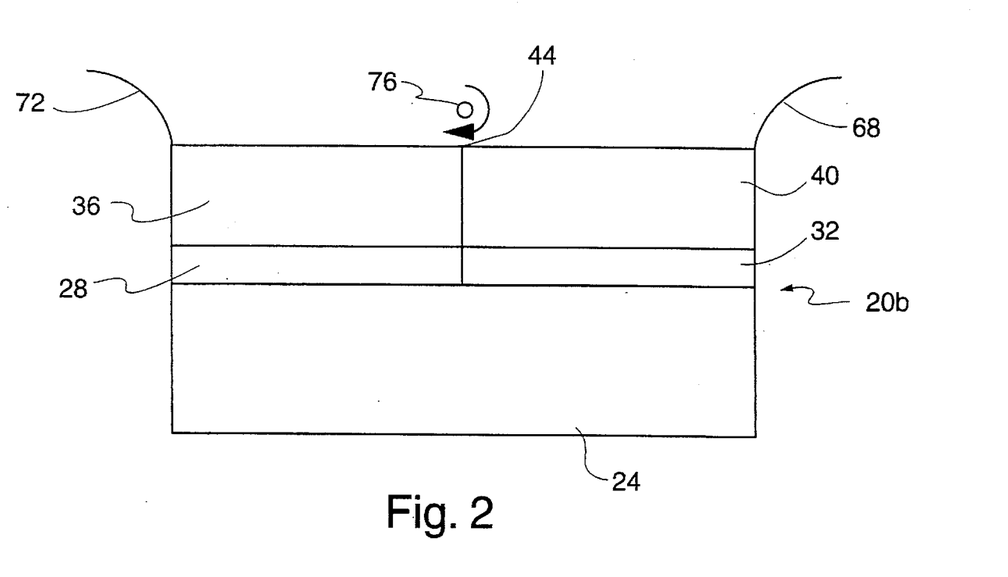
FIG. 2 is a side view of a three-terminal superconducting device according to a preferred embodiment of the present invention.

Referring to FIGS. 1 and 2, two-terminal and three-terminal superconducting devices according to the present invention are illustrated. Both types of superconducting devices have a first and second electrical lead 68, 72 for electrical connection of the device to a power source. A noted above, a third terminal 76 normal to the plane of the page is employed in the three-terminal superconducting device to regulate supercurrent flow between the first and second electrical terminals 68, 72. Although FIG. 2 illustrates the use of an electrical field produced by the third terminal 76 to regulate the supercurrent, as noted above other methods exist for the third terminal 76 to control supercurrent flow.

Referring now to FIG. 4, the substrate 24 is a crystalline material, preferably a monocrystalline material, that has a relatively high strength, is inexpensive, and is suitable for the epitaxial crystal growth of the first and second buffer layers 28, 32. "Epitaxial crystal growth" refers to oriented intergrowth between two solid crystalline phases in which the surface of one crystal provides, through its crystal lattice structure, preferred positions for the deposition of another crystal. Preferred substrates are composed of $SrTiO_3$, $MgO$, $Y—ZrO_2$, $LaAlO_3$, and $Al_2O_3$, and mixtures thereof, with the most preferred substrate composition being 9 molar percent yttrium oxide and 91 molar percent zirconium oxide.

The first and second superconductors 36, 40 preferably are high temperature superconductors (e.g., having a superconducting transition temperature no less than about 90°K.) and are able to grow epitaxially on the first and second buffer layers 28, 32, respectively. The first and/or second superconductors 36, 40 typically have a critical current of no less than about $1 \times 10^{-5}$ amps, a critical current density of no less than about $1 \times 10^6$ amperes/cm$^2$ at 77°K., a normal state resistivity of no more than about 200 microohms-cm at 95°K., and a critical magnetic field of no less than about 0.5 Tesla at 77°K. Preferably, the first and second superconductors 36, 40 have the same composition. The preferred composition for the first and second superconductors 36, 40 includes $Tl_2Ba_2CaCu_2O_8$, $Tl_2Ba_2Ca_2Cu_3O_{13}$, $Bi_2Sr_2Ca_2Cu_3O_{10}$, $Bi_2Sr_2CaCu_2O_8$, $YBa_2Cu_3O_{7-x}$, and other compounds in which the supercurrent is primarily propagated in the Cu—O planes.

The materials used for the first and second buffer layers 28, 32 preferably are able to grow epitaxially on the substrate surface 64 and have a selected lattice mismatch relative to the overlying superconductor. The preferred compositions for the layers are based upon the discovery that the magnitudes of the lattice mismatches between the first and second buffer layers and the first and second superconductors, respectively, determine the orientation of the first and second crystallographic planes 48, 60. Because the first and second buffer layers 28, 32 have different lattice mismatches with the first and second superconductors 36, 40, respectively, the layers will typically have different compositions. Specifically, the lattice mismatch between the first buffer layer 28 and the first superconductor 36 is preferably sufficient to cause the first crystallographic plane 48 to be substantially parallel to the first buffer crystallographic plane 52a and substrate crystallographic plane 56. Preferably, the lattice mismatch between the first buffer layer and the first superconductor is no more than about 3.0%, more preferably no more than about 2.5%, and most preferably no more than about 1.0%. Suitable materials for the first buffer layer include $CeO_2$, $LaAlO_3$, $SrTiO_3$, $PrBa_2Cu_3O_7$, $NdGaO_3$ and $Y_2O_3$. The lattice mismatch between the second buffer layer 32 and the second superconductor 40 is preferably sufficient to cause the second crystallographic plane 60 to be substantially parallel to the substrate surface 64, but not to the second buffer crystallographic plane 52b and substrate crystallographic plane 56. Preferably, the lattice mismatch between the second buffer layer and the second superconductor is at least about 3.5%, more preferable at least about 4.0%, and most preferably at least about 5.0%. Suitable materials for the second buffer layer include $MgO$, $Al_2O_3$ and $Y—ZrO_2$.

While not wishing to be bound by any theory, it is believed that the underlying reason the superconducting film grows with the crystallographic planes either parallel to the substrate surface or parallel to the substrate crystallographic planes is due to differing interfacial free energies at the buffer layer/superconductor interface. For small lattice mismatches (<3%) at the buffer layer/superconductor interface, it is energetically favorable for the superconducting film to adopt an epitaxial orientation with respect to the buffer layer and substrate, thus the crystallographic planes of the superconductor are parallel to the crystallographic planes of the substrate. For larger (>4%) lattice mismatches at the buffer layer/superconductor interface, the interfacial free energy of the system is higher, and the system adopts its lowest energy configuration by growing with the crystallographic planes parallel to the substrate surface. By way of example, since the lattice mismatch and interfacial free energy are minimal at the interface of buffer layer 52a and superconductor 48, the superconductor adopts an orientation in which the crystallographic planes are parallel to those of the vicinally-cut substrate 56, despite the fact that the surface free energy of superconductor 48 is higher than that of a superconducting material in which the low-index crystallographic planes 50a (e.g., (001)) are parallel to the substrate surface. Deposition of a buffer layer 52b which has a larger lattice mismatch relative to superconductor 60 creates a situation in which the interfacial free energy is higher, thus the overall free energy of the superconductor is minimized when the material grows with the low-index crystallographic planes 50b parallel to the substrate surface.

Although the differing lattice mismatches between the buffer layers and the overlying superconductors produce different crystallographic plane orientations in the superconductors, as shown in FIG. 4 the first and second buffer crystallographic planes 52a, 52b are typically substantially parallel to the substrate crystallographic plane 56. In other words, the orientation of the first and second crystallographic planes 48, 60 is typically not related to the orientation of the first and second buffer crystallographic planes 52a, 52b for higher lattice mismatches between the superconductor and underlying buffer layer.

Figure 5:
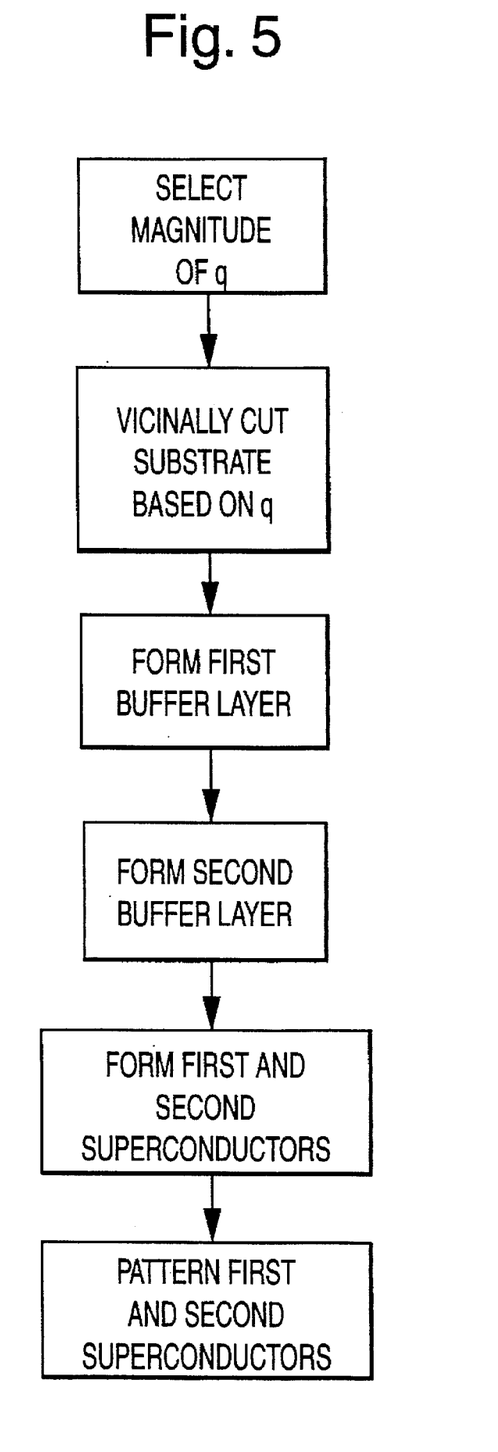
FIG. 5 is a flow schematic of a preferred process according to the present invention.

FIG. 5 is a flow schematic of the preferred process for forming the superconducting device of FIGS. 1–4. Because the process can produce any magnitude for θ (θ is no more than 90 degrees), the first step requires the selection of the desired magnitude of θ. The predetermined magnitude for θ is preferably based on the desired degree of depression in the superconducting properties across the junction 44 and more preferably on a desired critical current, critical current density, normal state resistance, and/or critical field across the junction 44. In most applications, the critical current at the junction 44 is no less than about 0.1% of the critical current in the first and/or second superconductors at a distance from the junction 44, the critical current density at the junction 44 is no less than about 0.1% of the critical current density in the first and/or second superconductors at a distance from the junction 44, and/or the critical field at the junction 44 is no less than about 0.1% of the critical field in the first and/or second superconductors at a distance from the junction 44. More specifically, at 77°K, the critical current across the junction 44 preferably ranges from about $1 \times 10^{-5}$ to about $1 \times 10^{-2}$, and more preferably from about $1 \times 10^{-4}$ to about $1 \times 10^{-2}$, amperes, the critical current density from about $1 \times 10^3$ to about $1 \times 10^4$ amperes/cm$^2$, the normal state resistivity from about 10 to about 1,000, and more preferably from about 100 to about 500, microohms-cm, and/or the critical magnetic field from about $1 \times 10^{-2}$ to about $1 \times 10^{-3}$ Tesla.

An important factor in selecting the desired magnitude of θ is the effect of θ on the crystal structure of the first and second superconductors 36, 40 at a distance from the junction 44. Although a higher magnitude for θ can be desirable to obtain the desired decrease in the superconducting properties across the junction 44, higher angle magnitudes can disrupt the crystal structure in the first and/or second superconductors 36, 40 at a distance from the junction 44, thereby causing a depression in the superconducting properties (e.g., critical current, critical magnetic field, normal state resistance and/or critical current density) in the superconductors at a distance from the junction 44. Accordingly in most applications, there is an optimal range for the magnitude of θ that is sufficient to produce the selected superconducting properties across the junction 44 while maintaining the superconducting properties of the first and second superconductors at a distance from the junction at a relatively high level, such as the levels noted above.

The optimal magnitude of θ in a given application depends on the orientation of the plane containing θ. Preferably, if θ is in a plane that is substantially parallel to the substrate surface 64, θ ranges from about 2 to about 40 degrees and more preferably from about 5 to about 30 degrees. If θ is in a plane that is substantially perpendicular to the substrate surface 64, θ preferably ranges from about 2 to about 20 degrees and more preferably from about 3 to about 15 degrees. The process for determining the optimal range for θ is described in detail below.

While not wishing to be bound by any theory, the optimal range of θ depends upon the orientation of the crystallographic planes and therefore the plane containing θ because the coherence length in a given crystallographic plane direction depends upon the plane direction. The coherence length is the distance that the superconducting charge carriers (e.g., electron hole pairs) can propagate in a disordered material without degradation of the critical current density (e.g., the coherence length is equivalent to the distance between the electron holes in an electron hole pair in a supercurrent). By way of example, for a superconductor such as YBCO the coherence length in the directions <100> and <010> is about 20 angstroms while the coherence length in the direction <001> is about 5 angstroms. Because, as noted above, higher magnitudes of θ create more disorder in the crystal structure at the junction 44, which in turn requires a smaller coherence length in the direction of the crystallographic planes to be an effective weak link junction, the optimal magnitude of θ is directly related to the magnitude of the coherence length in the direction of the crystallographic planes. Preferably, the ratio of the coherence length to θ ranges from about 0.15 to about 2 angstrom/degree.

After selecting the magnitude of θ, a substantially planar surface 64 is formed on the substrate 24 with the substrate surface 64 and the substrate crystallographic plane 56 forming the angle ø, which has substantially the same magnitude as the selected magnitude for θ. The substrate is formed by grinding a crystalline material off-axis from the desired crystallographic plane by the angle ø followed by parallel facing the opposite side of the substrate 24. The substrate can then be polished, for example by using colloidal alumina, and cleaned in an organic solvent, such as alcohol, to remove debris from the substrate surfaces.

The first buffer layer 28 can be formed on a portion of the substrate 24 by suitable deposition techniques. The substrate, for example, can be heated to a temperature ranging from about 600° to about 800° C. and the first buffer layer 28 formed by ion sputtering, laser ablation, or chemical vapor deposition techniques. To provide a surface for the deposition of the second buffer layer 32, a portion of the substrate can be blocked off by shadow masking techniques prior to deposition of the first buffer layer 28.

The second buffer layer 32 can be formed on the remaining portion of the substrate 24 by suitable techniques. In most applications, the technique used to form the second buffer layer 32 will be the same technique used for the first buffer layer 28. To protect the first buffer layer 28 during the deposition of the second buffer layer 32, the first buffer layer 28 can be isolated by shadow masking techniques. The first and second buffer layers 28, 32 typically have the same thicknesses, which preferably range from about 5 to about 700 angstroms.

Because the first and second superconductors in the preferred superconducting device configuration have the same composition, the first and second superconductors 36, 40 are preferably formed in the same deposition step. The superconductors are formed by suitable techniques, such as ion sputtering, laser ablation, or chemical vapor deposition techniques. The thicknesses of the first and second superconductors are substantially the same, preferably ranging from about 1000 to about 3000 angstroms.

Figure 3:
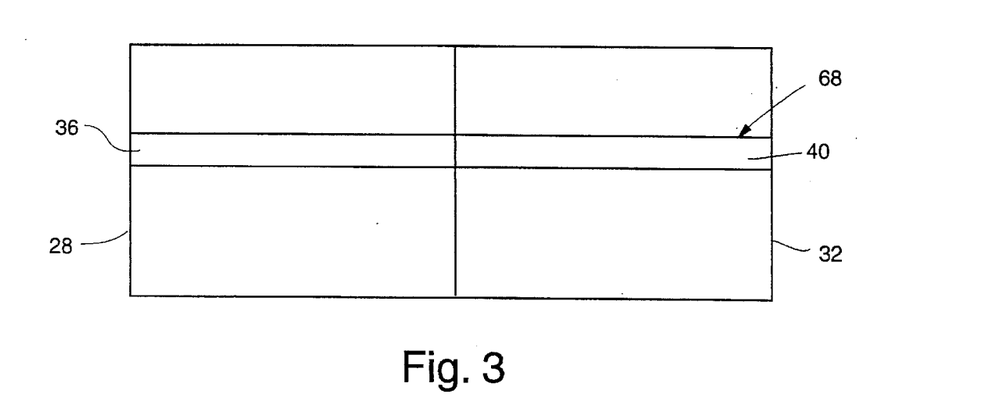
FIG. 3 is a top view of a weak link junction according to a preferred embodiment of the present invention.

Following formation of the first and second superconductors 36, 40, the superconductors can be patterned on the substrate 24 by suitable techniques, such as dry etching or chemical etching techniques. Referring to FIG. 3, the width of the superconductor line 68 after patterning is complete typically ranges from about 2 to about 50 microns.

Figure 6:
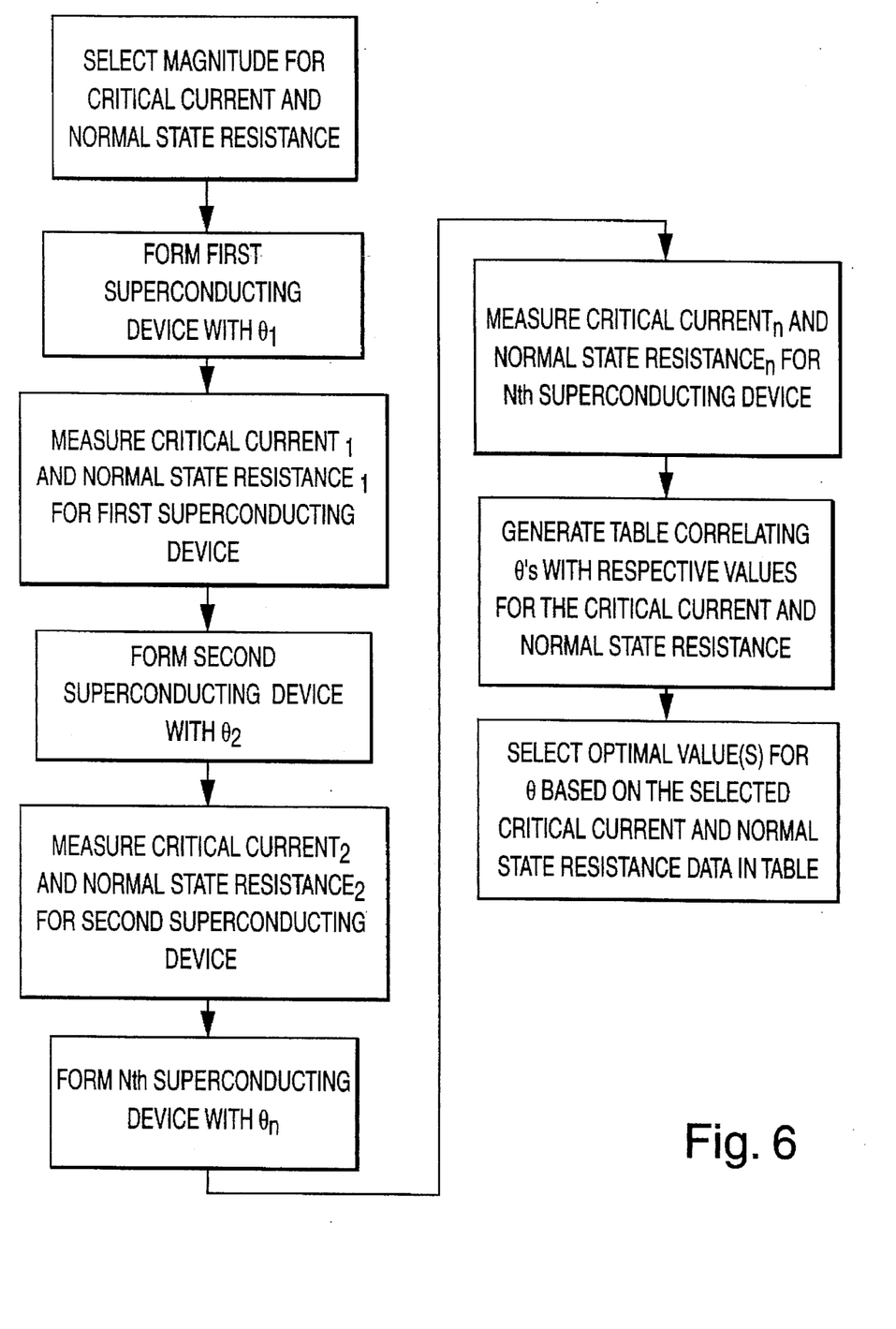
FIG. 6 is a flow schematic of a preferred process to optimize the magnitude of $\theta$.

The preferred process for selecting a substantially optimum magnitude for θ is illustrated in FIG. 6. As can be seen from FIG. 6, the process to optimize the magnitude for θ is an iterative process based upon measurements of selected variables in weak link junctions having progressively larger or smaller magnitudes of θ. A table containing data from the successive tests is prepared and used for selecting the optimal magnitude for θ.

In a first step of the process, a magnitude(s) for at least one of the following variables is selected for the weak link junction: critical current, critical current density, normal state resistance, and/or critical field. The preferred variables are the critical current and normal state resistance. The selection process for each of the variables is described in detail above.

A series of superconducting devices having different magnitudes of θ are then formed by the above-described process. In each of the superconducting devices, a line 68 is formed, with the lines 68 having common thicknesses and widths and therefore cross-sectional areas. Each superconducting device is subjected to a supercurrent which is incrementally increased in magnitude until a voltage is measured across the weak link junction (e.g., the junction transitions from a superconducting to a normal state). At that point, the voltage drop across the junction (e.g., the normal state voltage) and the current across the junction (e.g., the critical current) are measured. The resistance calculated based on the normal state voltage and the critical current is the normal state resistance. The critical current density can be computed based on the critical current and the cross-sectional area of the line 68.

After the desired range of magnitudes of θ is subjected to the preceding test to determine a critical current and normal state resistance for each magnitude of θ, a table is generated correlating each of the magnitudes of θ with their respective values for the critical current and normal state resistance. As will be appreciated, the number of magnitudes selected for θ (and the size of the increments between the magnitudes) depends upon the desired accuracy in determining the optimal magnitude of θ for a given application.

The optimal magnitude for θ is preferably the lowest magnitude of θ that yields the desired magnitude(s) for the selected variable(s) across the weak link junction 44. As noted above, the lowest magnitude for θ will produce the least amount of disordering not only at the weak link junction 44 but also in the superconductor at a distance from the junction. It is desired that the disordering in the superconductor at a distance from the junction be substantially minimized to inhibit superconductivity degradation in the superconductor away from the junction 44.

Figure 7:
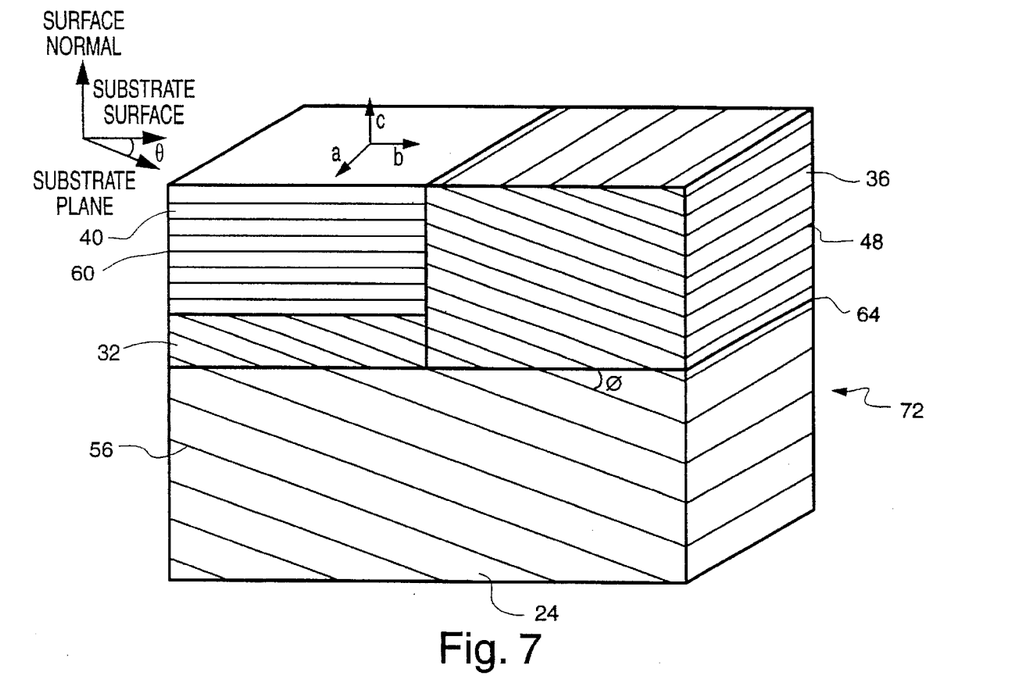
FIG. 7 is a three-dimensional view of a weak link junction according to another embodiment of the present invention.

Referring now to FIG. 7, another embodiment of a superconducting device 72 is illustrated. This embodiment differs from the embodiment of FIG. 4 in that the first buffer layer 28 is not included in the device of FIG. 7. In other words, the first superconductor 36 is formed directly on the substrate surface 64 and not on the surface of a buffer layer. This embodiment is useful where the lattice mismatch between the first superconductor 36 and the substrate surface 64 is preferably no more than about 3% and more preferably no more than about 2.5%. Suitable materials for the substrate in this embodiment include $CeO_2$, $LaAlO_3$, $SrTiO_3$, $PrBa_2Cu_3O_7$, $NdGaO_3$ and $Y_2O_3$ and for the first and second superconductors include $Tl_2Ba_2CaCu_2O_8$, $Tl_2Ba_2Ca_2Cu_3O_{13}$, $Bi_2Sr_2Ca_2Cu_3O_{10}$, $Bi_2Sr_2CaCu_2O_8$, $YBa_2Cu_3O_{7-x}$ and other compounds in which the supercurrent is primarily propagated in the Cu—O planes.

Figure 8:
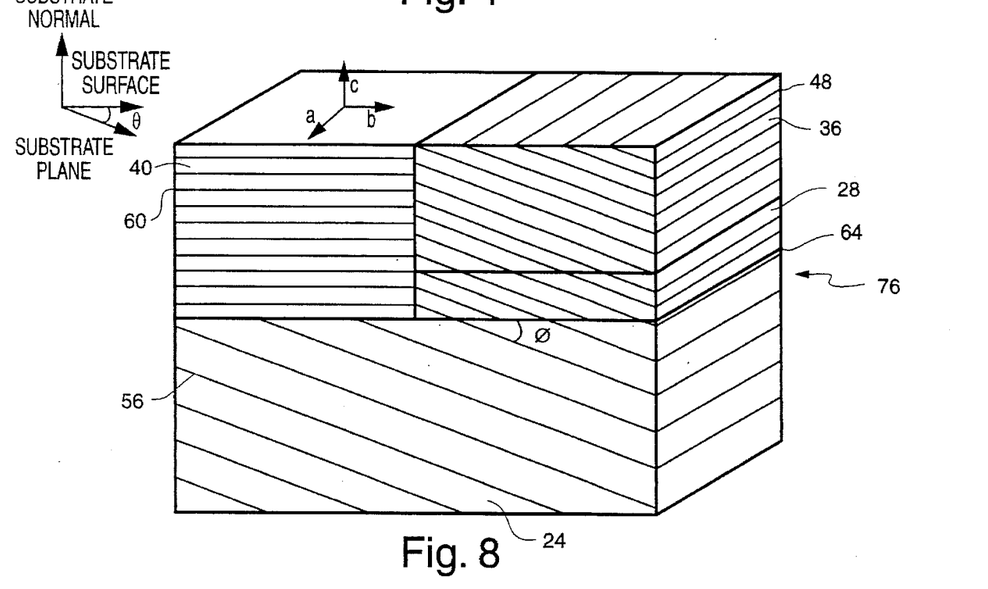
FIG. 8 is a three-dimensional view of a weak link junction according to another embodiment of the present invention.

Another embodiment of a superconducting device 76 is illustrated in FIG. 8. This embodiment differs from the embodiment of FIG. 4 in that the second buffer layer 32 is not included in the device of FIG. 8. Thus, as in the case of the first superconductor of the preceding embodiment, the second superconductor 40 is formed directly on the substrate surface 64 and not on the surface of a buffer layer. This embodiment is useful where the lattice mismatch between the second superconductor and the substrate surface is preferably at least about 4.0% and more preferably at least about 5.0%. Suitable materials for the substrate in this embodiment include MgO, $Al_2O_3$ and Y—$ZrO_2$, and for the first and second superconductors are as noted above in the preceding embodiment.

Figure 9:
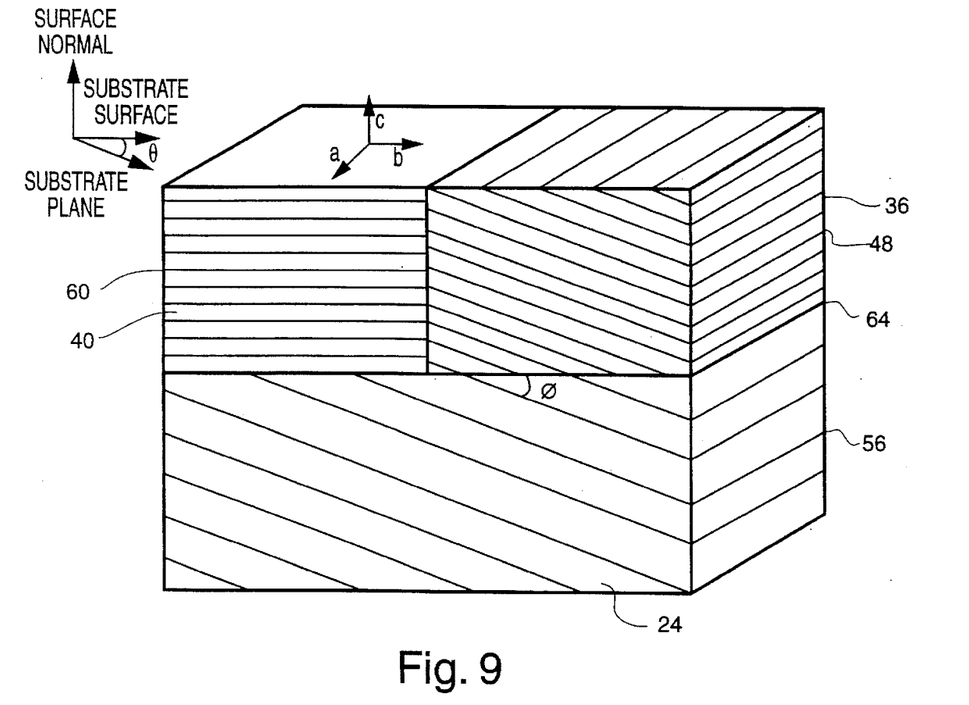
FIG. 9 is a three-dimensional view of a weak link junction according to another embodiment of the present invention.

Yet another embodiment of a superconducting device is illustrated in FIG. 9. This embodiment differs from the embodiment of FIG. 4 in that the first and second buffer layers 28, 32 are not included in the device of FIG. 9. Thus, the first and second superconductors 36, 40 are formed directly on the substrate surface 64 and not on the surface of a buffer layer. This embodiment is useful where the lattice mismatch between the first superconductor 36 and the substrate surface 64 is preferably no more than about 3.0% and more preferably no more than about 2.5% and the lattice mismatch between the second superconductor 40 and the substrate surface 64 is preferably at least about 4.0% and more preferably at least about 5.0%. Suitable materials for the substrate and first and second superconductors are selected to yield the lattice mismatches. Accordingly, the first and second superconductors preferably have different compositions.

EXAMPLES

Barrier layer and YBCO layers were sequentially deposited at 750° C. using a pulsed laser deposition system on various substrates. A Questek Model 2560 pulsed excimer laser, operating at 248 nanometers, 30 nanosecond pulses, and 5 pulses/second, was focused to 2.5–3.0 Joules/cm² on 1-inch diameter YBCO or barrier-layer target. The YBCO target was 96% dense. The $Y_2O_3$ and $Y_{0.13}Zr_{0.87}O_{1.94}$ targets, which were used for barrier layers, were fabricated by pressing the powders into discs, then firing at 950° C. for 12 hours. The barrier layer targets were approximately 65% dense. Up to three targets were mounted on a stainless steel holder. By rotating the target holder, sequential layers were deposited without breaking vacuum or reducing the substrate temperature. The barrier layers were 50–100 mm thick. All the barrier layers were deposited at an oxygen pressure of 40 mTorr. The YBCO layers were nominally 200 nm thick, and were deposited at an oxygen pressure of 200 mTorr. After the YBCO layers were deposited, the chamber was filled with oxygen, and the temperature was maintained at 750° C. for 20 minutes. The layers were cooled to 450° C. over 60 minutes, held at 450° C. for 45 minutes to insure complete oxygenation, then cooled to room temperature over the next 45 minutes.

The layers were characterized using electrical resistivity versus temperature, critical current density ($J_c$), scanning electron microscopy (SEM), and X-ray diffraction (XRD) measurements.

Using YBCO with different buffer layers, the following results were obtained:

TABLE 1

| Superconductor/ Buffer Layer(s) | Substrate vicinal. Angle θ between (001) Y-ZrO$_2$ and the surface normal. | Angle θ between (001) YBCO and surface normal. | Full-Width Half-Maximum of the (005) YBCO peak. | (001) YBCO lattice parameter (λ) | Critical current density (Amps/cm$^2$, at 77° K.) | Zero resistance temperature (°K.) |
|---|---|---|---|---|---|---|
| YBCO/Y$_2$O$_3$ | 3.6° | 3.0° | 0.9° | 11.71 | 1.3 × 10$^6$ | 89.6 |
| YBCO/Y$_2$O$_3$/Y-ZrO$_2$ | 20.4° | 19.0° | 0.7° | 11.70 | 9.0 × 10$^5$ | 89.1 |
| YBCO/Y$_2$O$_3$ | 35.7° | 34.8° | 0.8° | 11.68 | — | 87.0 |
| YBCO/Y-ZrO$_2$ | 4.1° | 0° | 1.5° | 11.76 | 9.0 × 10$^5$ | 86.9 |
| YBCO/Y-ZrO$_2$/Y$_2$O$_3$ | 35.7° | 0° | 1.0° | 11.69 | 4.1 × 10$^4$ | 88.8 |

Deposition of Y$_2$O$_3$ barrier layers on vicinally-cut Y—ZrO$_2$ substrates prior to YBCO deposition resulted in YBCO layers with the (001) planes approximately parallel to (001) Y—ZrO$_2$, even for Y—ZrO$_2$ substrates cut 35.7 degrees from (001) (12.6 degrees from (101)). In contrast, when Y—ZrO$_2$ barrier layers were deposited prior to YBCO on similarly vicinal substrates, the YBCO (001) planes were aligned parallel to the substrate surface and, therefore, the angle between the (001) directions of the Y—ZrO$_2$ substrate and YBCO layer was the vicinal angle. This behavior correlates with the better lattice matching at the YBCO/Y$_2$O$_3$ interface (2.7% mismatch) than at the YBCO/Y—ZrO$_2$ interface (5.9%). Better lattice matching was also consistent with the narrower x-ray diffraction full-width half-maximum (FWHM) values for the YBCO layers on Y$_2$O$_3$ barrier layers. The similarity between the Y$_2$O$_3$ and YBCO FWHM values suggests the YBCO values are limited by those of Y$_2$O$_3$.

Turning to the electrical properties of the YBCO layers, it was discovered that YBCO/Y$_2$O$_3$ layers had lower resistivities when deposited on substrates with low vicinal angles. As the vicinal angle increased, scattering at grain boundaries (possibly high-angle) and carrier propagation along directions not parallel to (001) YBCO was increased. In contrast, a different behavior was observed for YBCO layers deposited on Y—ZrO$_2$ buffer layers. Since (001) YBCO grew parallel to the surface on both the 4.1 and 35.7 degree vicinal substrates, the resistivity values of the YBCO/Y—ZrO$_2$ layers on the 4.1 degree vicinal substrate were close to those reported for highly (001)-oriented layers.

Similar to normal state resistivity data, $J_c$ values of YBCO/Y$_2$O$_3$ layers were strongly influenced by the substrate vicinal angle. The effects of substrate vicinal angle on $J_c$ of YBCO/Y—ZrO$_2$ layers were not as severe because the YBCO (001) planes were parallel to the surface.

While various embodiments of the present invention have been described in detail, it is apparent that modifications and adaptations of those embodiments will occur to those skilled in the art. However, it is to be expressly understood that such modifications and adaptations are within the scope of the present invention, as set forth in the following claims.

What is claimed is:

1. An apparatus for depressing a superconducting wave function of a superconducting material, comprising:

a substrate having a substantially planar surface located at a vicinal angle to a crystallographic plane of the substrate;

a first superconducting material located adjacent to the planar surface and having a first crystallographic plane that is substantially parallel to the substrate crystallographic plane;

a second superconducting material, contacting the first superconducting material to form a junction therebetween, located adjacent to the planar surface, the second superconducting material having a second crystallographic plane that is substantially parallel to the planar surface to form a junction angle with the first crystallographic plane at the junction, wherein a first interfacial free energy between the first superconducting material and the planar surface causes the first superconducting material to grow epitaxially such that the first crystallographic plane is substantially parallel to the substrate crystallographic plane and a second interfacial free energy between the second superconducting material and the planar surface causes the second superconducting material to grow non-epitaxially such that the second crystallographic plane is substantially parallel to the planar surface and wherein the junction angle is substantially identical to the vicinal angle and the junction depresses the superconducting wave function across the junction.

2. The apparatus as claimed in claim 1, wherein:

the substrate comprises a first buffer layer forms a part of the planar surface and is located beneath the first superconducting material and a second buffer layer forms a part of the planar surface and is located beneath the second superconducting material, a third crystallographic plane in the first buffer layer and a fourth crystallographic plane in the second buffer layer both being substantially parallel to the substrate crystallographic plane.

3. The apparatus as claimed in claim 1, wherein the substrate comprises:

a first buffer layer that forms a portion of the planar surface and contacts the lower surface of the first superconducting material and a second buffer layer that forms a portion of the planar surface and contacts the lower surface of the second superconducting material and wherein the first buffer layer is selected from the group consisting of $CeO_2$, $LaAlO_3$, $SrTiO_3$, $PrBa_2Cu_3O_7$, $NdGaO_3$, and $Y_2O_3$ and the second buffer layer is selected from the group consisting of MgO, $Al_2O_3$, and Y—$ZrO_2$.

4. The apparatus as claimed in claim 3, wherein:
the substrate is selected from the group consisting of $SrTiO_3$, MgO, Y—$ZrO_2$, $LaAlO_3$, and $Al_2O_3$.

5. The apparatus as claimed in claim 1, wherein the substrate comprises:
a first buffer layer that is located beneath the first superconducting material and a second buffer layer that is located beneath the second superconducting material and the substrate, the first and second buffer layers having different compositions and being deposited by the same process.

6. The apparatus as claimed in claim 1, wherein:
the junction angle is in a plane that is substantially perpendicular to the planar surface.

7. The apparatus as claimed in claim 1, wherein:
the junction angle is no less than about 3°.

8. The apparatus as claimed in claim 6, wherein:
a first lattice mismatch between the first superconducting material and the planar surface is less than a second lattice mismatch between the second superconducting material and the planar surface and wherein the first lattice mismatch is no more than about 3% and the second lattice mismatch at least about 3.5%.

9. The apparatus as claimed in claim 1, wherein:
the junction angle is in a plane that is substantially perpendicular to the planar surface and ranges from about 2° to about 20°.

10. The apparatus as claimed in claim 6, wherein:
the vicinal angle and the junction angle are located in substantially parallel planes.

11. The apparatus as claimed in claim 10, wherein the substrate comprises:
a buffer layer located below at least one of the first and second superconducting materials to yield a predetermined crystal orientation in the superconducting material, wherein when the buffer layer is located between the first superconducting material and the substrate a first lattice mismatch between the first superconducting material and the planar surface is no more than about 3% and when the buffer layer is located between the second superconducting material and the substrate a second lattice mismatch between the second superconducting material and the planar surface is at least about 3.5%.

12. The apparatus as claimed in claim 10, wherein the first and second superconducting materials have substantially the same composition and the substrate comprises:
a first buffer layer below the first superconducting material and a second buffer layer below the second superconducting material to cause the first and second superconducting materials to have different crystal orientations wherein a first lattice mismatch between the first buffer layer and the first superconducting material is less than a second lattice mismatch between the second buffer layer and the second superconducting material and the first lattice mismatch is no more than 3% and the second lattice mismatch is at least about 3.5%.

13. The apparatus as claimed in claim 1, wherein the first and second superconducting materials have substantially the same composition and the substrate comprises:
a first buffer layer beneath the first superconducting material and a second buffer layer beneath the second superconducting material to cause the first and second superconducting materials to have different crystal orientations, wherein the first and second buffer layers have different compositions and wherein a first lattice mismatch between the first buffer layer and the first superconducting material is less than a second lattice mismatch between the second buffer layer and the second superconducting material, the first lattice mismatch being sufficient to cause the first crystallographic plane to be substantially parallel to the substrate crystallographic plane and the second lattice mismatch being sufficient to cause the second crystallographic plane to be substantially parallel to the substrate surface.

14. A method for forming a weak link junction at a junction between a first and a second superconducting material, comprising the steps of:

(a) providing a crystalline substrate;

(b) selecting a magnitude for a junction angle between a first crystallographic plane of the first superconducting material and a second crystallographic plane of the second superconducting material that is sufficient to produce at the junction a predetermined value for at least one of the following variables: critical current density, critical current, normal state resistance, and critical magnetic field;

(c) forming a substantially planar surface on the substrate with the surface and a crystallographic plane of the substrate forming a vicinal angle having substantially the magnitude of the junction angle;

(d) forming the first superconducting material above the planar surface, wherein the first crystallographic plane is substantially parallel to the substrate crystallographic plane; and (e) forming the second superconducting material above the planar surface, wherein the second crystallographic plane is substantially parallel to the planar surface to form the weak link junction with the junction angle having substantially the magnitude from the selecting step, wherein the junction angle is in a plane that is substantially perpendicular to the substantially planar surface and the vicinal angle and the junction angle are located in substantially parallel planes.

15. The method of claim 14, wherein:
the first and second superconducting materials are formed on a common substrate.

16. The method of claim 14, wherein the step (d) comprises:
selecting a first buffer layer material yielding a first interfacial free energy at a first interface between the first superconducting material and the planar surface, the first interfacial free energy being low enough to cause the first crystallographic plane to be substantially parallel to the substrate crystallographic plane; and forming the first buffer layer on the substrate; and wherein the third forming step comprises:

selecting a second buffer layer material yielding a second interfacial free energy at a second interface between the second superconducting material and the planar surface, the second interfacial free energy being high enough to cause the second crystallographic plane to be substantially parallel to the substantially planar surface, wherein the first interfacial free energy is less than the second interfacial free energy; and forming the second buffer layer on the substrate.

17. The method of claim 14, wherein:

the critical current density ranges from about $1 \times 10^5$ to about $1 \times 10^6$ amps/cm$^2$.

18. The method of claim 14, wherein:

the critical current ranges from about $1 \times 10^{-4}$ to about $1 \times 10^{-2}$ amps.

19. The method of claim 14, wherein:

the normal state resistivity ranges from about 10 to about 1000 microohms-cm.

20. The method of claim 14, wherein:

the critical magnetic field ranges from about $1 \times 10^{-2}$ to about $1 \times 10^{-5}$ Tesla.

21. The method of claim 14, wherein step (c) comprises:

epitaxially growing a first buffer layer on a first portion of the planar surface; and epitaxially growing a second buffer layer on a second portion of the planar surface, the first portion being located adjacent to the second portion.

22. A method for forming a weak link junction at the junction between two superconducting materials, comprising the steps of:

(a) providing a substrate having a substantially planar surface oriented at a vicinal angle to a crystallographic plane of the substrate;

(b) forming a first buffer layer and a second buffer layer on separate portions of the substrate;

(c) forming a first superconducting material above the first buffer layer, wherein a first interfacial free energy at a first interface between the first superconducting material and the first buffer layer is low enough to cause a first crystallographic plane in the first superconducting material to be substantially parallel to the substrate crystallographic plane; and (d) forming a second superconducting material above the second buffer layer, wherein a second interfacial free energy at a second interface between the second superconducting material and the second buffer layer is high enough to cause a second crystallographic plane in the second superconducting material to be substantially parallel to the planar surface to form the weak link junction at the junction between the first and second superconducting materials, wherein the first interfacial free energy is less than the second interfacial free energy.

23. The method as claimed in claim 16, wherein:

a first lattice mismatch between the first buffer layer and the first superconducting material is no more than about 3%.

24. The method as claimed in claim 22, wherein:

the first superconducting material includes a first plurality of crystallographic planes, including the first crystallographic plane, and the second superconducting material includes a second plurality of crystallographic planes, including the second crystallographic plane, with the first and second plurality of crystallographic planes being substantially free of in-plane rotation relative to one another.

25. The method as claimed in claim 23, wherein:

a second lattice mismatch between the second buffer layer and the second superconducting material is at least about 3.5%.

26. A method for forming a weak link junction at a junction between at least two superconducting materials, comprising the steps of:

(a) selecting at least one of the following variables for the weak link junction: critical current, critical current density, critical field, and normal state resistance and a magnitude for the selected variable across the weak link junction;

(b) forming a first weak link junction on a first vicinally cut substrate having a first junction angle between the crystallographic planes in the superconducting materials at the first weak link junction that is substantially equal to a first vicinal angle;

(c) measuring the selected variable across the first weak link junction;

(d) forming, after the first measuring step, a second weak link junction on a second vicinally cut substrate having a second junction angle between the crystallographic planes in the superconducting materials at the second weak link junction that is substantially equal to a second vicinal angle, the magnitude of the first junction angle being different from the magnitude of the second junction angle;

(e) measuring the selected variable across the second weak link junction; and (f) selecting a magnitude of a junction angle between the crystallographic planes in the superconducting materials at the weak link junction that is sufficient to produce the selected variable at the weak link junction while producing a relatively low amount of disordering in the crystal structure at the weak link junction.

27. The method as claimed in claim 26, wherein:

the selected variable is critical current and the critical current in the superconducting materials at a distance from the junction is more than about 100 times greater than the selected critical current across the weak link.

28. The method as claimed in claim 26, wherein:

the selected variable is critical current and the selected critical current at the weak link is no less than about $5 \times 10^{-5}$ amps.

29. The method as claimed in claim 26, wherein:

the superconducting materials are located on an upper surface of a substrate, the angle between the crystallographic planes at the weak link junction is in a plane substantially parallel to the upper surface, and the junction angle between the crystallographic planes ranges from about 2 to about 40 degrees.

30. The method as claimed in claim 26, wherein:

the superconducting materials are located on an upper surface of a substrate, the angle between the crystallographic planes at the weak link junction is in a plane substantially perpendicular to the upper surface, and the junction angle between the crystallographic planes ranges from about 2 to about 20 degrees.

31. The method as claimed in claim 26, wherein:

the critical current of the superconducting materials at a distance from the junction is no less than about $5 \times 10^{-5}$ amps.

32. The method as claimed in claim 26, wherein:

the selected variable is the critical current and normal state resistance and the cross-sectional areas of the superconducting materials at the first weak link junction and second weak link junction are substantially equal.

33. The method as claimed in claim 32, wherein:

the superconducting materials at the first and second weak link junctions have substantially the same thicknesses.

34. The method as claimed in claim 26, wherein the first measuring step comprises:

increasing the current across the first weak link junction until a normal state voltage is detected across the first weak link junction; and measuring the normal state voltage across the first weak link junction.

35. The method as claimed in claim 34, wherein the first measuring step comprises:

measuring the critical current across the first weak link junction.

36. The method as claimed in claim 26, wherein:

the selected variables are the critical current and normal state resistance and wherein the second selecting step comprises:

selecting the magnitude of the junction angle based on a first critical current and a first normal state resistance corresponding to the first weak link junction and a second critical current and a second normal state resistance corresponding to the second weak link junction.

37. The method as claimed in claim 26, wherein:

the selected magnitude of the junction angle is substantially the lowest magnitude of the junction angle that produces the selected magnitude of the selected variable.

38. A product produced by the process of claim 26.

39. An apparatus for depressing a superconducting wave function of a superconducting material, comprising:

a substrate having a substantially planar surface located at a vicinal angle to a crystallographic plane of the substrate;

a first superconducting material located adjacent to the planar surface and having a plurality of first crystallographic planes in which at least one of the first crystallographic planes is substantially parallel to the substrate crystallographic plane;

a second superconducting material, contacting the first superconducting material to form a junction therebetween, located adjacent to the planar surface, the second superconducting material having a plurality of second crystallographic planes in which at least one of the second crystallographic planes is substantially parallel to the planar surface to form a junction angle with the first crystallographic plane at the junction, wherein the plurality of first crystallographic planes is substantially free of in-plane rotation relative to the plurality of second crystallographic planes, the junction depressing the superconducting wave function across the junction.

40. The apparatus as claimed in claim 39, wherein:

a first interfacial free energy at a first interface between the first superconducting material and the planar surface causes the first superconducting material to grow epitaxially such that the first crystallographic plane is substantially parallel to the substrate crystallographic plane and a second interfacial free energy at a second interface between the second superconducting material and the planar surface causes the second superconducting material to grow non-epitaxially such that the second crystallographic plane to be substantially parallel to the planar surface.

41. The apparatus as claimed in claim 40 wherein:

a first lattice mismatch between the first superconducting material and the planar surface is no more than about 3% and a second lattice mismatch between the second superconducting material and the planar surface is at least about 3.5%.

42. The apparatus as claimed in claim 39 wherein:

a first lattice mismatch between the first superconducting material and the planar surface is less than a second lattice mismatch between the second superconducting material and the planar surface and the first interfacial free energy is less than the second interfacial free energy.

43. A method for forming a weak link junction at a junction between a first and a second superconducting material, comprising the steps of:

(a) forming a surface on the substrate with the surface and a crystallographic plane of the substrate forming a vicinal angle;

(b) epitaxially growing the first superconducting material above the substrate surface; and (c) non-epitaxially growing the second superconducting material above the substrate surface.

44. The method of claim 43, wherein the first superconducting material includes a first crystallographic plane that is substantially parallel to the substrate crystallographic plane and the second superconducting material includes a second crystallographic plane that is substantially parallel to the substrate surface to form the weak link junction therebetween.

45. The method of claim 43, wherein the first superconducting material includes a plurality of first crystallographic planes and the second superconducting material includes a plurality of second crystallographic planes and the plurality of first crystallographic planes is substantially free of in-plane rotation relative to the plurality of second crystallographic planes.

* * * * *